(12) United States Patent
Ensher (10) Patent No.: US 12,278,461 B1
(45) Date of Patent: Apr. 15, 2025

(54) SYSTEM AND METHODS FOR STABLE, FAST, WIDE-TUNING RANGE HYBRID LASERS

(71) Applicant: Insight Photonic Solutions, Inc., Lafayette, CO (US)

(72) Inventor: Jason R. Ensher, Lafayette, CO (US)

(73) Assignee: Insight Photonic Solutions, Inc, Lafayette, CO (US)

( * ) Notice: Subject to any disclaimer, the term of this patent is extended or adjusted under 35 U.S.C. 154(b) by 639 days.

(21) Appl. No.: 17/676,418

(22) Filed: Feb. 21, 2022

(51) Int. Cl.
*H01S 5/0687* (2006.01)
*G02F 1/21* (2006.01)
*H01S 5/10* (2021.01)
*H01S 5/323* (2006.01)

(52) U.S. Cl.
CPC ............ *H01S 5/0687* (2013.01); *G02F 1/212* (2021.01); *H01S 5/1028* (2013.01); *H01S 5/1042* (2013.01); *H01S 5/1071* (2013.01); *H01S 5/323* (2013.01)

(58) Field of Classification Search
CPC ........................... H01S 5/1028; H01S 5/1042
See application file for complete search history.

(56) References Cited

U.S. PATENT DOCUMENTS 9,692,207 B2 * 6/2017 Fang ..................... H01S 3/0675
2022/0320825 A1 * 10/2022 Moehrle ................. H01S 5/125

* cited by examiner

*Primary Examiner* — Tuan N Nguyen
(74) *Attorney, Agent, or Firm* — Renner, Otto, Boisselle & Sklar, LLP (57) ABSTRACT

A hybrid laser is provided having a tuning structure that alters a wavelength range of an amplified lightwave in a micro-ring resonator (MRR). The tuning structure alters an index of refraction of a tuned ring resonator to alter the index of refraction.

27 Claims, 3 Drawing Sheets

SYSTEM AND METHODS FOR STABLE, FAST, WIDE-TUNING RANGE HYBRID LASERS

RELATED APPLICATIONS

This application claims the benefit of 63/154,243 filed on Feb. 26, 2021. Which is herein incorporated by reference in its entirety.

TECHNICAL FIELD

The present disclosure relates generally to control systems and more particularly to controlling hybrid lasers.

BACKGROUND

Hybrid lasers use a III-V active (or gain) region combined with a photonic integrated circuit made of a passive material such as Silicon or Silicon Nitride (SiN) for precise laser wavelength and power tuning.

SUMMARY

It is possible to make fixed wavelength or moderately tunable lasers for emitting light across the visible and mid-infrared wavelengths using devices consisting of only III-V materials. Unfortunately it is expensive to develop monolithic III-V lasers to achieve the reliability and performance needed in many applications. Also, creating the required tuning structures for fast and wide tuning can be non-trivial in III-V materials. By contrast in hybrid lasers of Silicon or Silicon Nitride (SiN), precision manufacturing (e.g., based on techniques used in chip manufacturing) allows for more easy production of structures of micro-ring resonators (MRRs), racetrack resonators (RTRs), Asymmetric Mach-Zehnder Interferometers (AMZIs), Sagnac rings, grating mirrors, etc. Each of these structures may be tuned to select the operating wavelength of the hybrid SiN laser, by using temperature, stress or coupling to an electro-optical material to change optical phase of light in the structure. The mechanism itself is often referred to as a phase modulator.

One of the present limitations of Silicon or SiN tuning structures is that the tuning mechanisms are either slow (e.g., thermo-optic tuning through heaters) with response times of approximately 1 msec or fast but too lossy (1-10 nsec, but with many dB of loss for instance using Lithium Niobate films). Stress optic tuning has been demonstrated in the research literature with low loss and 100's of nsec tuning speeds in phase modulators, and have been proposed in the prior art as a laser tuning mechanism.

The tuning speed problem is compounded by the fact that hybrid lasers in the prior art are Vernier-tunable devices with a complicated mode structure that requires non-monotonic tuning of the tuning voltages. For example, the ring mode spacing in a typical hybrid laser may be ~1 nm, and these lasers may be tuned across 100 nm. This requires ~100 steps, each with a response time determined by the phase modulator tuning mechanism. In the case of a thermal tuner, it may be that to tune 100 nm in this manner requires 100×1 msec=100 msec to sweep the 100 nm. For a stress optic tuner, the tuning may be faster (100×250 nsec=25 usec) but still the overhead from these tuning speed delays adds up and may limit the application of hybrid lasers. For instance, OCT lasers today sweep 100 nm in 1-5 usec. Fiber sensing is requiring sweeps that are 10 usec to 1 msec.

A laser design and tuning methodology has been demonstrated with the rings and phase section adjusted synchronously to stay in a continuous, single longitudinal mode of the laser, over a much wider range than the FSR of the laser cavity. In recent results, such lasers are only able to achieve ~0.2 nm continuous tuning, though the laser is able to tune overall ~120 nm. The laser linewidth during continuous thermal tuning remains narrow, on the order of kHz. A need remains in applications (such as OCT, spectroscopy, others cited above) for a laser that can sweep 30-100 nm with coherence lengths of approximately 3 mm to up to 1 m. The laser does not need to stay in the same single longitudinal mode throughout the sweep, and the instantaneous linewidth during the sweep does not need to be 1-10 kHz, i.e. coherence lengths of ~300 to 30 km (which is typical for hybrid SiN lasers).

Thus there is a need for hybrid laser designs that are optimized for swept wavelength operation that minimize the delays due to the finite speeds of phase modulator tuning mechanisms. Further, there is a need to tuning systems and methods to achieve higher speeds.

Another challenges for phase modulators using thermal or stress tuning is the relatively high V$\pi$-L, which is the product of applied voltage and modulator length to achieve a pi optical phase shift in the modulator. In order to encourage larger regions of single-longitudinal mode operation, the ring structures in a hybrid laser tend to have smaller dimensions to increase the Free Spectral Range (FSR). But this means that the voltage to achieve pi phase shift is increased. For a thermal tuning mechanism, this means 100's of mW can be required for tuning, and this complicated thermal control and can lead to cross-talk with other components on the PIC. For stress optic modulators, this challenge can lead to excessively high voltages.

Thus, there is a need for hybrid lasers with much larger tuning structures.

Yet another challenge for tuning hybrid lasers is calibrating their wavelength versus the tuning parameters and keeping the laser calibrated over time or due to changes in environmental conditions. Hybrid lasers may be especially susceptible to changes in laser calibration over time or environmental conditions because of the hybrid integration of the gain region, the Si or SiN PIC, and the phase modulator. The gain material itself will degrade over time, changing the laser cavity. The interface between the gain and the PIC may change. The interface between the thermal or stress-optic tuning element may age. Heat, humidity, shock and vibration may change the tuning characteristics. Thus, there is a need to monitor the laser's optical output power and wavelength, such that the laser's characteristic may be maintained over time.

The present disclosure provides swept or tunable laser sources with higher tuning speed, simpler mode structure, and more wavelength and power stability over a wide variety of wavelength ranges from visible (such as 400 nm) to mid infrared (such as 2-3 μm wavelengths).

The present disclosure provides a system and method for precisely controlling fast swept or tunable wavelength hybrid laser sources and may be applied to fields such as spectroscopy, swept-source interferometry, Optical Coherence Tomography, OFDR, OFDI, surface metrology, holography, displays, fiber sensing (such as with FBGs or FP-based sensors), spectroscopy, spectroscopic remote sensing or FMCW lidar.

While a number of features are described herein with respect to embodiments of the invention; features described with respect to a given embodiment also may be employed in connection with other embodiments. The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

The present invention is described below in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

DETAILED DESCRIPTION

According to a general embodiment, a hybrid laser is provided having a tuning structure that alters a wavelength range of an amplified lightwave in a micro-ring resonator (MRR). The tuning structure alters an index of refraction of a tuned ring resonator of the MRR using thermal, stress optic or electro-optic mechanisms.

The hybrid laser 10 may combine Silicon Nitride (SiN) hybrid laser designs using two MRRs with an Asymmetric Mach-Zehnder Interferometer (AMZI) filter to enable broad tuning range of the laser with fewer restrictions on the free spectral range (FSR) or Q-factor of the MRRs. In III-V materials (which have high losses per unit length), adding ring structures to enhance tuning range also increases losses due to the increased length. For this reason, the combination of MRRs and AMZIs in Silicon or SiN hybrid lasers has not previously been demonstrated, perhaps because the loss per unit length is substantially less than in III-V materials. But one advantage not appreciated in the art is that combining the AMZI with MRRs allows for greater design flexibility and features that cannot otherwise be achieved.

One challenge for SiN hybrid lasers is to achieve extremely wide tuning ranges. Existing hybrid laser designs, using only two MRRs, achieve wide tuning through the Vernier effect, causing the free spectral range (FSR) of each of the MRR to be slightly different. The tuning range is often expressed as the repeat mode spacing (RMS) of the MRRs given by:

$$RMS = \frac{FSR1 * FSR2}{(FSR1 - FSR2)},$$

where FSR1 is the free spectral range of the first MRR and FSR2 is the free spectral range of the second MRR.

From the RMS relation, the tuning range of a laser using two MRRs is defined by the FSR of the MRRs, and by minimizing the difference between the two FSRs.

The FSR of an MRR is defined by the radius and the index of refraction of the MRR and is given by:

$$FSR = \frac{\lambda^2}{n_g * L},$$

where $\lambda$ is the laser wavelength, $n_g$ is the group index of the waveguide and L is the circumference of the MRR.

An important property of an MRR is the Q-factor. The Q-factor expresses the ratio of the energy of the light in the MRR to the amount of light that is lost. The Q-factor (also referred to as Q) is related to the wavelength of light ($\lambda$) and the wavelength or channel width ($\delta\lambda$) of each mode in the spectral transmission as follows:

$$Q = \frac{\lambda}{\delta\lambda}$$

Figures 1, 2, 3:
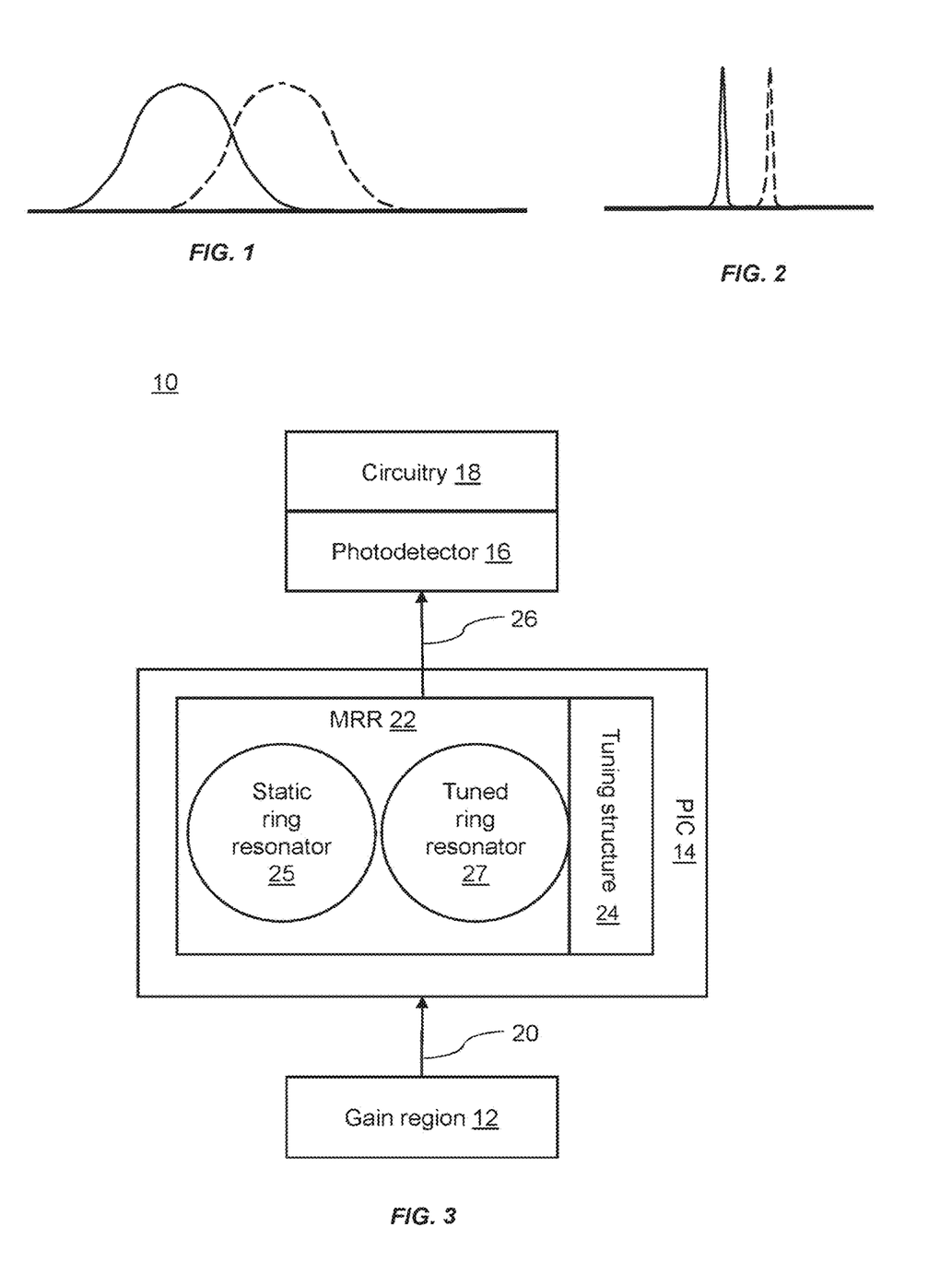
FIG. 1 is an exemplary plot of the optical transmission versus wavelength of two micro-ring resonators (MRRs) having low Q.
FIG. 2 is an exemplary plot of the optical transmission versus wavelength of two MRRs having high Q.
FIG. 3 is a schematic diagram of an exemplary embodiment of a hybrid laser.

FIG. 1 shows an exemplary plot of four micro-ring resonators (MRRs) having low Q. Similarly, FIG. 2 shows an exemplary plot of four MRRs having high Q.

In an MRR formed in SiN, it is possible to achieve Q-factors of $10^5$-$10^7$, depending on the waveguide losses, coupling coefficients from the MRR to adjacent waveguides, and the bend radius of the MRR.

The role of the AMZI in the laser cavity is to suppress ring cavity modes that may be close together during tuning of the laser. This can result because the peak reflectivity of the ring modes is unchanged across the gain spectrum of the laser, which can lead to competition between ring modes at the extremes of wavelength tuning. The additional loss added by the AMZI can suppress this mode competition, leading to a more stable laser that can reach nearly the full range of the Repeat Mode Spacing.

High Q resonators for wavelength tuning may also be fabricated in the shape of elongated or elliptical racetracks with long straight section connected to circular end waveguides. Racetrack resonators (RTRs) offer the potential for longer paths, and hence shorter FSRs, while also offering long, straight waveguides for placement of phase-modulation section (on one or both legs)—which may be advantageous for modulator efficiency. An RTR also has an FSR like an MRR as formulated above, except that the length L corresponds to the total length around the racetrack. Similarly, tuning enhancement for a laser may be achieved via the Vernier effect between two RTRs of slightly different FSRs.

Using the principle of the Repeat Mode Spacing, it is possible to understand the typical approach to achieving wide tuning range in a hybrid SiN laser. First, keep the FSR of the rings relatively large, and make the difference between the FSRs small. In the recent work by Van Rees, which is typical of lasers in the prior art, the ring FSRs are 1.533 nm and 1.583 nm, leading to an RMS of 49 nm. There is an alternative approach to making a wide tuning range: make the FSR of the rings relatively small, and take advantage of the high Q to make the FSR difference even smaller. This latter idea is one of the key teachings of the present invention.

In the embodiment shown in FIG. 3, a hybrid laser 10 includes a gain region 12, a silicon based photonic integrated circuit (PIC) 14, a photodetector 16, and circuitry 18. The gain region 12 is made from group III-V semiconductor materials and generates an amplified lightwave 20. The PIC 14 is optically coupled to the gain region 12 and receives the amplified lightwave 20. The PIC 14 includes two micro-ring resonators (MRR) 25 and 27 as a part of MRR structure 22, optionally a phase section 29, and a tuning structure 24. The MRR 22 includes a static ring resonator 25 and a tuned ring resonator 27. The static ring resonator 25 and tuned ring resonator 27 are described herein as part of a MRR 22, but each ring resonator 25, 27 may be considered to be a MRR individually. In alternative embodiments, the MRRs may be replaced with RTRs with equivalent functionality.

The MRR 22 receives the amplified lightwave 20, and generates and emits a tuned lightwave 26 having a different wavelength range than the amplified lightwave 22 (i.e., the MRR 22 alters a wavelength range of the amplified lightwave 22). The tuning structure 24 is coupled to the tuned ring resonator 27 of the MRR 22 and alters the wavelength range of the tuned lightwave 26 through changing a repeat mode spacing of the MRR 22 by affecting a free spectral range (FSR) of the tuned ring resonator 27 via altering an index of refraction of the tuned ring resonator 27. As is described in further detail below, the tuning structure may use thermo-optic, stress-optic or electro-optic effects to alter the index of refraction of the tuned ring resonator 27. For example, the tuned lightwave 26 may comprise a subset of the wavelengths included in the amplified lightwave 20 that is generated by the MRR 22 removing certain wavelengths included in the amplitude lightwave 20. As another example, the MRR 22 may alter the amplitude of the wavelengths of the wavelength range of the amplified lightwave 20.

In one embodiment, the PIC 14 is made from at least one Silicon (Si) or Silicon Nitride (SiN). Heating SiN or Si causes a change in the index of refraction, as well as expansion, and may be used to thermo-optically tune the wavelength of the tuned ring resonator on the photonic integrated circuit (PIC). In a SiN hybrid laser using heating elements to perform thermo-optic tuning, the ring radii of the MRR may be small and still achieve a π phase shift within each ring (i.e., shifting by a wavelength amount along the optical path length that is equal to half of the wavelength). Achieving a π phase shift enables continuous tuning across the tuning range defined by the RMS.

Thermo-optic tuning may be fast enough for some applications, such as spectroscopy or fiber sensing, where update rates may be 1 Hz to 10 kHz. The thermo-optic response time of 1 msec reported for SiN structures may be fast enough to enable sweep repetition rates for such applications. But challenges remain in using thermo-optic tuning. For one, heaters for thermo-optic tuning consume 100-500 mW of power to achieve full π phase shift tuning. In addition to the high power consumed, the heat energy can cause a thermal lag in tuning response and hysteresis in response that makes quick changes or reversals in tuning slower and more complicated to calibrate. In addition, laser designs in the art presently use ring modes that are ~1 nm range such that covering a wide range such as 100 nm means connecting 100 such modes. If delays are required at each transition, then the sweep time may be constrained to 100 times 1 msec=100 msec. One aspect of the present invention is the implementation of larger resonant rings that meet the optical performance of certain applications (such as spectroscopy, fiber sensing or even certain slower interferometric measurement applications). Larger resonant rings or racetracks require less heat to achieve the same change in optical path length. And the larger rings have smaller FSR, which may be may make the laser wavelengths high enough resolution to match the application and to allow monotonic tuning of the thermal tuners.

Thermo-optic tuning is too slow for some applications. For example, in SiN material thermo-optic tuning has a response time of ~1 msec. By contrast, applications such as OCT or FMCW Lidar demand sweeps with a period of 1-250 usec (or even less). For this reason, in one embodiment, the tuning structure does not rely on thermal effects to alter the index of refraction of the tuned ring resonator. The relative slowness of thermo-optic tuning is due to the time taken to heat and/or cool the MRR. To achieve faster tuning (e.g., on the order of ~250 nsec), an alternative mechanism is to use stress-optic tuning (i.e., applying stress to the tuned ring resonator to modulate the index of refraction of the tuned ring resonator).

In one embodiment, the tuning structure includes a piezo electric layer (e.g., a piezoelectric material as a film that acts as an actuator for stressing the tuned ring resonator). In one embodiment, the MRR 22 (i.e., the portion of the SiN acting as a waveguide) may include piezo-electric films on the surface of the MRR.

Using piezo materials to construct a phase modulator and affect the index of refraction uses much less power and is faster than thermally altering the index of refraction. However, the stress optic effect may be much weaker (e.g., by a factor of ten) than the thermal optic effect.

Vπ-L is a measure of the combination of voltage and length of an actuator that cause a particular wavelength shift. The Vπ-L is typically better (i.e., lower) for thermal optic tuning than it is for stress optic tuning. Consequently, using stress optic tuning to cause the same shift in wavelength as thermal optic tuning typically requires that the length of the actuator or the voltage applied to the actuator be increased. For example, to keep the voltage low enough for practical applications, the MRR 22 may have a larger radius when performing stress-optic tuning than when performing thermo-optic tuning. An RTR, in place of the MRR, is another means to lengthen the interaction region of the modulator, thereby keeping the modulation voltage lower to achieve π phase shift. Lower voltages are desirable to minimize power consumption in the electronics, keep voltage slew rates within tolerance, as well as to access certain classes of common, environmentally stable electronic components (such as desirable in industrial and automotive applications).

As described above, the tuning range of the hybrid laser 10 is based on the RMS of the MRR 22, which is based on the FSR of the static ring resonator 25 and the FSR of the tuned ring resonator 27. The drawback of using stress-optic tuning is that to achieve very wide tuning ranges (such as 100 nm) the FSR of the static ring resonator 25 and the tuned ring resonator 27 must be relatively close together. However, despite it being possible to achieve a high Q factor in SiN, it is difficult to consistently achieve a high enough Q factor in SiN to suppress competition between ring modes across wide tuning ranges (e.g., 100 nm or greater). In the embodiment shown in FIG. 4, the MRR 22 may also include at least one additional ring resonator 30 that affects the wavelength range of the tuned wavelength 26.

Figure 4:
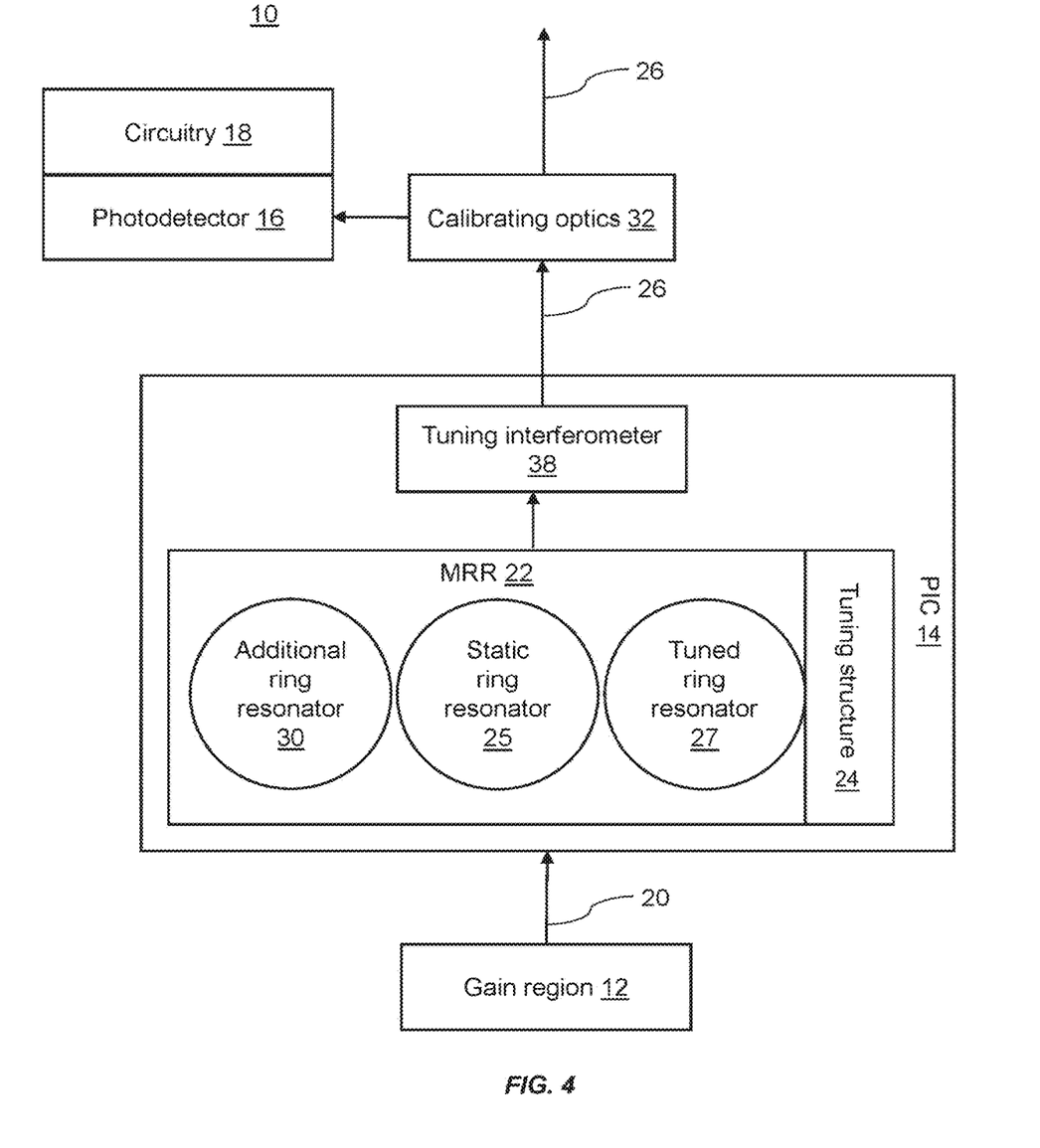
FIG. 4 is a schematic diagram of an exemplary alternative embodiment of a hybrid laser.

However, by using larger ring circumferences for the static ring resonator 25 and the tuned ring resonator 27, it is possible for the hybrid laser 10 to use the stress-optic effect for tuning. Increasing the ring circumference of the static ring resonator 25 and the tuned ring resonator 27 decreases the FSR of the static ring resonator 25 and the tuned ring resonator 27. To alleviate this issue, the hybrid laser 10 may use an interferometer 38 (referred to as a tuning interferometer), such that the tuning range of the hybrid laser 10 is defined by the path length difference in the tuning interferometer 38 (e.g., an asymmetric Mach-Zehnder interferometer (AMZI)) in combination with the repeat mode spacing defined by the FSRs (and difference between the FSRs) of the static ring resonator 25 and the tuned ring resonator 27. For example, the FSR of the static ring resonator 25 and the tuned ring resonator 27 may be chosen to optimize gain margin between adjacent modes and may be kept different enough that the Q required by the static ring resonator 25 and the tuned ring resonator 27 is smaller.

Consequently, as shown in the embodiment depicted in FIG. 4, the PIC 14 may include the tuning interferometer 38 positioned to receive the tuned lightwave 26 emitted by the MRR 22. The tuning interferometer 38 further alters the wavelength range of the tuned lightwave 26 and emits the tuned lightwave 26. That is, the tuning interferometer 38 both receives and outputs the tuned lightwave 26 received from the MRR 22. In one embodiment, the tuning interferometer 38 is an AMZI. For example, the AMZI may include a primary path and a reference path. A path length difference of the AMZI is equal to a difference in the path length of the primary path and the reference path. A tuning range of the AMZI is defined by a wavelength range of the tuned lightwave 26 emitted by the tuning interferometer 38 and is defined by the path length difference.

Thus, an embodiment of the hybrid laser 10 including a tuning interferometer 38 (such as an AMZI) and a static ring resonator 25 and the tuned ring resonator 27 in a SiN hybrid laser with stress-optic tuning mechanism helps solve the problem of excessively large Q-factors required for SiN hybrid lasers to achieve wide tuning ranges when using two ring resonators. Both the interferometer and the MRR may be formed in Si or SiN.

Figure 5:
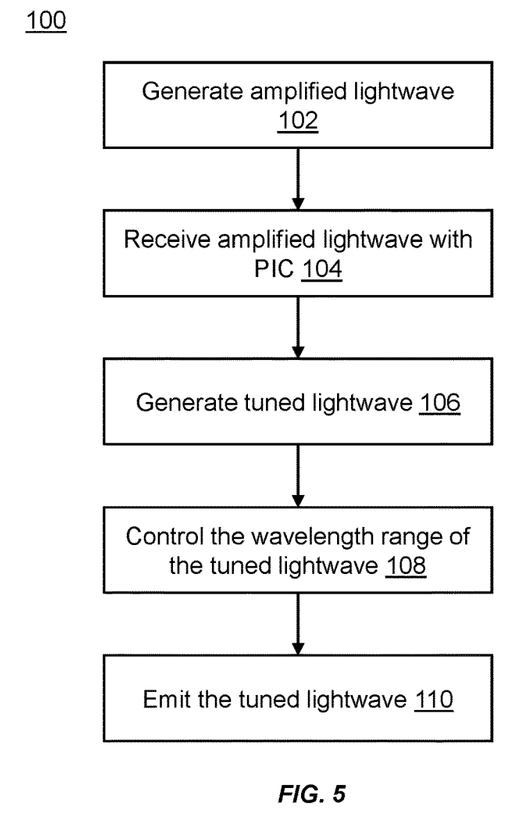
FIG. 5 is an exemplary embodiment of a tuning structure of the hybrid laser.

An exemplary embodiment of a tuning structure 24 is shown in FIG. 5, the tuning structure 24 may be embodied as an AMZI including different phase modulators 40a, 40b positioned on different arms 42a, 42b of the tuning structure 24.

Figure 6:
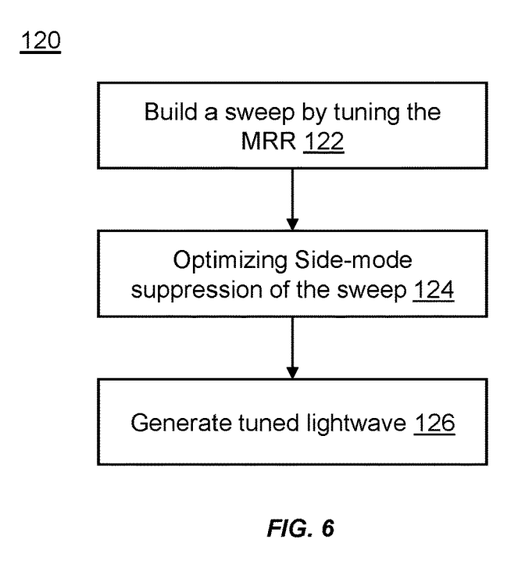
FIG. 6 is a flow diagram of an exemplary method for tuning a hybrid laser.

In the embodiment shown in FIG. 6, a method 100 is shown for tuning the hybrid laser 10. In process block 102, an amplified lightwave 26 is generated using a gain region 12 of the hybrid laser 10 made from group III-V semiconductor materials. In process block 104, the amplified lightwave 26 is received using a silicon based photonic integrated circuit (PIC) 14 of the hybrid laser 12. In process block 106, a tuned lightwave 26 is generated having a different wavelength range than the amplified lightwave 20 by altering a wavelength range of the amplified lightwave 20. In process block 108, the wavelength range of the tuned lightwave is controlled by altering the wavelength range of the tuned lightwave through changing a repeat mode spacing of the MRR by affecting a free spectral range (FSR) of the tuned ring resonator via altering an index of refraction of the tuned ring resonator using a tuning structure of the hybrid laser that is coupled to the tuned ring resonator. As described above, the wavelength range of the tuned lightwave is not controlled by relying on thermal effects to alter the index of refraction of the tuned ring resonator. The wavelength range is also controlled by detecting a wavelength and power of the tuned wavelength using a photodetector and modulating the altering of the index of refraction by the tuning structure based on the detected wavelength and power of the tuned wavelength. In process block 110, the tuned lightwave 26 is emitted.

In the embodiment shown in FIG. 7, an exemplary method 120 is shown for tuning a hybrid laser having a gain region made from group III-V semiconductor materials, a silicon based photonic integrated circuit (PIC) optically coupled to the gain region and including a micro-ring resonator (MRR) and a tuning structure, a photodetector, and circuitry. In process block 122, a sweep (also referred to as a lightwave is built by tuning the MRR to cover a broad wavelength range including a transition from a first mode of the MRR to a second mode of the MRR. The spacing between the first mode and the second mode is an increment of a wavelength of the sweep.

In process block 124, a side-mode suppression of the sweep is optimized by tuning a cavity length of the MRR to match a wavelength of the sweep via altering an index of refraction of the tuned ring resonator. That is, a section of the PIC in the optical path of the laser cavity is tuned to optimize and line up a wavelength of the lightwave with the laser's cavity length (e.g., optimizing side mode suppression).

In process block 126, in parallel with the building of the sweep or the optimizing of the side-mode suppression ratio, an interferometer is tuned to suppress competing modes by removing unwanted wavelengths from the sweep. The suppression of the competing modes extends a single mode tuning range during the sweep.

The hybrid laser 10 may have a tuning range (defined by a wavelength range of the tuned lightwave) that is greater than 100 nm. For example, the hybrid laser 10 may be used in applications related to OCT, spectroscopy, LiDAR, beam steering, etc. The amplified lightwave 20 and the tuned lightwave 26 may have any suitable wavelength range. For example, the wavelength range may include the wavelengths 400 nm and 2-3 µm.

In one embodiment, the tuning structure 24 includes an electro-optically active layer. For example, the tuning mechanism for the Si or SiN PIC may be formed using an electro-optically active layer, such as Lithium Niobate. Such electro-optically-active material can achiever low Vπ-L, allowing for smaller tuning structures to be employed.

The electro-optical layer may be applied as a film or bond a wafer of Lithium-Niobate to the surface of the SiN. The layer may be placed between the waveguide and the Li-Nio film/wafer so that the modes evanescently couples.

As described above, the hybrid laser 10 includes a photodetector 16 and circuitry 18. The photodetector 16 detects a wavelength and power of the tuned lightwave 26. The circuitry 18 controls the wavelength range of the tuned lightwave 26 by modulating the altering of the index of refraction by the tuning structure 24 based on the detected wavelength and power of the tuned wavelength 26. In one embodiment, the hybrid laser 10 additionally includes calibrating optics 32 that direct a portion of the tuned lightwave 26 to the photodetector 16. For example, the calibrating optics 32 may include an interferometer.

In one embodiment, the calibrating optics include multiple interferometers. For example, the interferometers may include at least two interferometers having different free spectral ranges. By utilizing two interferometers having different FSRs, measurement of the wavelength across the wavelength range of the sweep may be improved by using one interferometer for coarse measurement of the wavelength of the tuned lightwave 26 and the other interferometer for fine measurement of the wavelength of the tuned lightwave 26. The FSR of one of the interferometers may be small compared to the total tuning range, such that the slope of the interferometric signal enables sensitivity to small changes in the laser wavelength. In one exemplary configuration, the laser may be designed for 100 nm and the FSR of this first interferometer may be ~0.5-1 nm, enabling sensitivity to changes in laser wavelength of on the order of 0.001 nm. In addition, for this exemplary configuration, a second interferometer may have an FSR that is comparable to or longer than the tuning range of the laser such as 150 nm (though small FSRs as little as about 50 nm may be used). The second interferometer with long FSR provides the ability to identify the coarse wavelength value of the laser across multiple ring or AMZI modes and, when used in combination with the first interferometer, provide precise wavelength measurement over the entire tuning range.

One approach to sweeping the wavelength of a laser is to use a continuous tuning mechanism, such as a MEMS mirror on a laser cavity, a spinning grating in an external cavity laser, or in a MEMS tunable VCSEL. But to create a sweep that is linear in optical frequency versus time can require pre or post-calibration of the continuous sweep. An aspect of the present embodiment is to simplify how a laser steps through the required minimum optical frequency step by designing a first ring resonator (i.e., the static ring resonator 25) such that $FSR1=\delta v$, in conjunction with a second slightly different ring resonator (i.e., the tuned ring resonator 27) that allows for Vernier tuning. Then, as the tuned ring resonator 27 is tuned (e.g., either thermally with a heater element or through a stress-optic mechanism like a piezo film) the laser 10 may be tuned through control of only one control parameter in equal optical frequency steps. Then to create a linear sweep of optical frequency versus time, it is only necessary to sweep the FSR in a monotonic and calibrated profile with time. In certain embodiments, it may be possible that the FSR may be swept linearly with time. As described above, adding an AMZI filter to the laser cavity can allow the Q of the static ring resonator 25 and the tuned ring resonator 27 to be kept below manufacturable values. A phase tuning section may be added to optimize the side mode suppression ratio (SMSR) of the laser during tuning, by concurrent tuning with the static ring resonator 25 and the tuned ring resonator 27 or the AMZI. The FSR of the rings may be 1000 or 10,000 smaller than the total tuning range, and may be only about 2-10× the laser cavity FSR. One potential advantage of these embodiments of the laser is that as the laser transitions from mode to mode during the sweep, the SMSR of the primary lasing mode does not change substantially (though it may be smaller SMSR than hybrid lasers in the prior art) and the output power of the laser changes less mode to mode.

Such a preferred embodiment for sweeping a hybrid laser has several advantages over other Vernier tunable lasers such as a VT-DBR, as well as MEMS-VCSELs. For instance, it is typical to use DBR mirrors in place of MRRs in a VT-DBR, such as made from an all-semiconductor device of InP, with DBR supermodes (the equivalent to ring resonator modes in a hybrid laser) that are ~4-6 nm. Thus, in order to tune the full ~40 nm wavelength range for a C-band VT-DBR laser, a non-monotonic waveform for each of the DBR mirrors and phase section is required. In summary, three different control currents are tuned non-monotonically. As the currents transition from one limit to another, settling time for the laser or the electronics are required, which creates a timing overhead that increases the sweep time. By contrast, the present disclosure may use one section as shown in FIGS. 8A and 8B (e.g., modulating a parameter 44 of the tuned ring resonator 27), two sections as shown in FIGS. 9A and 9B (e.g., modulating a parameter 44a, 44b of the tuned ring resonator 27 and either a phase section tuning element 29 or the tuning interferometer 38), or three sections as shown in FIGS. 10A and 10B (e.g., modulating a parameter 44a-44c of the tuned ring resonator 27, a phase section tuning element 29, and the tuning interferometer 38) tuned monotonically to cover the full tuning range without electrical settling time from non-monotonic resetting of the tuning currents or voltages. A further advantage of monotonically-tuning the control currents or voltage to the hybrid laser tuning sections is the ability to complete a wide wavelength sweep very quickly. For example, if the modulators are based on piezo-electric films, then even a 10-90 response time of 250 nsec could support a sweep repetition rate of 0.35/250 nsec=1.4 MHz. If these modulators are driven by a quasi-sinusoidal signal, or quasi-triangular waveforms, then both the upwards and downwards tuning could be used to double the duty cycle and potentially achieve 2.8 MHz wavelength sweep repetition rate. These rates are faster than are commercially available from MEMS-VCSEL lasers, which are 200 kHz, and even research demonstrations at ~1 MHz.

In one embodiment, the circuitry 18 causes the wavelength range of the tuned lightwave 26 to vary in time by a defined pattern, such that the defined pattern has a smallest wavelength step between instances of time. In this embodiment, an FSR of at least one of the tuned ring resonator or the static ring resonator matches the smallest wavelength step.

For example, the ring radius of the static ring resonator 25 and the tuned ring resonator 27 may be such that the FSR of the MRR 22 matches the smallest wavelength step (i.e., the smallest change in wavelength during the sweep). The wavelength step may be determined based on the application that the hybrid laser 10 is being used for (e.g., OCT, LiDAR, etc.). The ring radius of the static ring resonator 25 and the tuned ring resonator 27 result in an FSR matching the smallest wavelength step has the dual benefit of increasing the length over which the heat or the stress may be applied to the waveguide (i.e., by resulting in a larger ring radius), which reduces the voltage needed to achieve a IT phase shift. An exemplary embodiment is a hybrid laser 10 used with interferometry, such as Optical Coherence Tomography for medical imaging. The imaging depth of an OCT system is given by:

$$z = \frac{c}{4\delta v}$$

where c is the speed of light and $\delta v$ is the optical frequency step of the laser, as the laser steps through a wavelength range to create interferograms from an interferometry system.

In another embodiment, concurrent with the wavelength sweep or tuning of the hybrid laser the output power of the laser is controlled synchronous with the sweep to produce a desired optical output power vs. time profile. As described below, there are three embodiments for achieving power vs. time control in a hybrid laser. In many applications, such as spectroscopy, fiber sensing, FMCW lidar or OCT, it may be advantageous to have a constant power vs. time (and vs. wavelength of a sweep). Alternatively, it may be advantageous to program a Gaussian or other temporal window function (e.g. tapered-cosine, Kaiser, Hanning, etc.) to enable FFT post-processing. However, when the laser is tuned through transitions from one single-longitudinal mode the another single-longitudinal mode, the output power of the laser can vary. In an all-semiconductor laser such as a VT-DBR (of which the SG-DBR laser is but one example) in which there is an SOA section outside the laser cavity, the variation in laser output power may be handled by adjusting the current to the SOA. A hybrid SiN laser typically has only a gain section.

One embodiment for controlling the output power during the sweep is to add an additional III-V chip to provide a separate SOA section to the hybrid laser, such as on the output of the SiN tuning PIC. Coupling two or more III-V semiconductors to a single SiN PIC has been demonstrated. The advantage of this embodiment is that it provides a power control outside the laser cavity. This approach has two potential disadvantages. First, it but may not be cost-effective as it requires an additional chip to chip alignment. Second, optical feedback from outside the laser source may be amplified through the SOA and could destabilize the laser. An optical isolator may be needed.

A second embodiment for controlling the output power during the sweep of a hybrid laser is to control the current to the gain section. An advantage of this embodiment is that another SOA chip is not required. A further complication of controlling the gain current during the sweep is that this can change the laser cavity length. For example, if the output power is low during a moment in time of the sweep, and the gain current is increased to compensate for the lower power, then this will in turn lengthen the cavity and change the output wavelength from the desired value. Fortunately, inventions exist to manage this problem, such as U.S. Pat. No. 10,868,405. As the gain section current increases, and increases the cavity length, then for example the voltage to a phase section in the SiN PIC can be reduced to reduce the cavity length. And concurrently, the MRR wavelength can be reduced to optimize the wavelength.

A third embodiment for controlling the output power during the sweep of a hybrid laser is use a MZI attenuator on the SiN PIC, outside the laser cavity. The embodiment using an MZI attenuator architecturally works similar to the extra SOA, except without the ability to amplify the laser's output power. An advantage of the programmable attenuator is that backreflected light is not amplified, and hence the laser is not more susceptible to optical feedback. If the MZI is tuned using one of the fast electro-optic or piezo-electric mechanisms discussed herein, then the power tuning of the laser may be performed at the same speed as the wavelength tuning.

A fourth embodiment for controlling the output power during the sweep of a hybrid laser is use a MZI attenuator on the SiN PIC, inside the laser cavity.

A further aspect of the embodiments to control the laser power with an inter-cavity element or an intra-cavity element (such as the gain section, or an intra-cavity attenuator) is that the wavelength tuning controls may need to be tuned non-linearly. For instance, if the voltage or current to the modulator on a phase section is adjusted to maintain the optimal cavity length, even as the gain section current increases or decreases, then the voltage vs. time profile to the phase section tuner may remain monotonic, but is non-linear and not necessarily a simple function (linear quadratic, exponential, etc.) of voltage or current vs time. The same may be true for the tuners in the MRR, RTR, or AMZI sections of the laser. Thus, an aspect of the invention is that circuits that drive these sections may need to be of an arbitrary waveform nature, possibly based on a digitally-defined waveform over time to achieve the prescribed optical frequency and optical power sweep vs. time.

The circuitry 18 may have various implementations. For example, the circuitry 18 may include any suitable device, such as a processor (e.g., CPU), programmable circuit, integrated circuit, memory and I/O circuits, an application specific integrated circuit, microcontroller, complex programmable logic device, other programmable circuits, or the like. The circuitry 18 may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the circuitry 18. The circuitry 18 may be communicatively coupled to the computer readable medium and network interface through a system bus, mother board, or using any other suitable structure known in the art.

As an example, to achieve a 40 mm imaging depth in an OCT system operating at 1060 nm, such as might be useful for ophthalmology, a wavelength step of about 7 pm across the total wavelength tuning range of the laser (which may be 100 nm) is required. The 7 pm MRR FSR makes for a large radius ring (14.5 mm), which allows $V\pi$ to be kept low (single digit volts) if $V\pi$ L is ~20 V-cm. In a preferred embodiment, as the MRR tunes the wavelength over 100 nm, a phase section in the cavity with similar fast modulation material could concurrently tune 100 nm to match the laser cavity length to the wavelength and optimize the SMSR of the laser. As the laser is swept over 100 nm, it will be tuned over 100/0.007=14,286 modes of the ring resonator. Each of these modes are single-longitudinal modes of the laser, and due to the long cavity length of the hybrid laser cavity (comprising at least the two MRRs, a phase section and possibly an AMZI tuning section) and the low-losses of the SiN material, each mode has a narrow linewidth, at least better than 1 MHZ, and more probably 1-100 kHz. Thus, such a swept wavelength hybrid laser may be suitable for applications requiring wide wavelength range and narrow linewidth.

Although the laser mode spacing is very close together, the effective linewidth of the laser during the sweep can be sufficient for OCT, where coherence lengths of 3-100 mm up to even 1 m are desirable. Example of swept-wavelength lasers with centimeter-long cavities lasers with sufficient coherence length for OCT are given in the literature and are available commercially. The lasers described are not monolithically or even hybridly integrated such as the hybrid lasers of the present invention. As such, lasers of the present invention offer several advantages over these other lasers with cavity lengths of centimeters. First, the cavity is more stable as it consists of a solid PIC contacted with a gain chip, making the hybrid laser a better choice for environments with shock and vibration. Second, the tuning mechanism of the hybrid laser may be more repeatable than a moving MEMS mirror, making the wavelength tuning of the hybrid laser more repeatable and hence making the hybrid laser more suitable for phase-sensitive OCT or greater sweep-to-sweep repeatability for spectroscopy. Third, the tuning mechanisms of the hybrid laser are not subject to resonant tuning such as a MEMS free-space cavity, allowing the hybrid laser to operate over a wider range of possible tuning speeds up to the response limitation of the tuning mechanism (be it thermal, stress-optic or electro-optic).

Another application for which small, discrete wavelength steps may be desirable is beam steering. A laser with wide wavelength tuning, with the light coupled through a dispersive optical element such as a prism, diffraction grating, optical phase array or similar structure, can provide a mechanism-free or akinetic approach to beam steering that is very fast (as fast as the laser wavelength may be tuned). In the present invention, certain embodiments describe a laser with internal mode sizes, such as the FSR of a MRR, that match the desired beam steering step increment, thereby simplifying the calibration of beam steering that is enabled through tuning of the laser wavelength.

If can tune in known steps the angle of steering. through the dispersion coefficient there is a value for gratings on the order of 0.8 degrees per nm so that can steer the light according to this slope (non-linear so changes but this is a first order approximation). Convenient way to use a Vernier tuned structure (laser) to affect beam steering.

Another application that could benefit from a laser with small, equal optical frequency steps of the laser is optical holography, either for data storage or displays. In a holographic medium, data may be encoded and stored at different angles. For retrieval of the data stored in each hologram it may be beneficial to step through the angle-encoded holograms by stepping through the wavelength of light that interrogates the holographic media. The media might be a photosensitive polymer or film. An alternate, related application is for rendering holograms or displaying scenes via holograms using some dispersive media. Similar to the data storage application, tuning a laser in precise steps over a range of wavelengths may allow for the rendering of an image with perceived depth or motion, as the wavelength steps change the angle that the dispersively-stored or projected image is rendered onto a display, headgear or eye wear.

In another embodiment of the invention, the laser's internal cavity structure may be designed to produce regions of narrow tunability in equal optical frequency or wavelength increments. The idea is that not all applications need continuous wavelengths over the full wavelength range. So, for example, the ring modes might not be fully tunable to fully overlap one to another, so what that would mean is that you would need to hop from one ring mode to another ring mode (skipping some number of wavelengths), but once in the ring modes have narrow tunability where tuning is continuous (potentially enabled by concurrent tuning of a phase section in the cavity that optimizes SMSR within the ring mode tuning range). The wavelength increments do not necessarily overlap or need to be contiguous with other regions. This may be useful for spectroscopy, fiber sensing or lidar where certain features may only exist within certain wavelength bands. As an example, in certain applications it may be beneficial to have the laser operate in 2 nm steps and be sweepable in each 2 nm subregion by 0.1 nm. This might be ideal for gas spectroscopy. Then the first FSR of the MRR in a Si or SiN hybrid laser could be designed to be 2 nm. The second FSR of a second MRR could be designed to provide optimal gain margin. An AMZI could be added to the laser to provide wide wavelength tunability, such as 20-150 nm. And a phase tuning section could allow, operating alone or tuned concurrently with one or more of the two MRRs or the AMZI, to sweep the laser continuously over ~0.1 nm.

The photodetector 16 and/or circuitry 18 may be located on-chip for wavelength and power monitoring to account for the aging and temperature sensitivity of PZT films or LiNbO layers. By measuring the wavelength and adjusting or recalibrating the response of the PZT or LiNbO layers, in each tunable component such as the MRRs, the AMZI, the phase section, or other components over temperature or aging, the laser's wavelength sweeping or power output properties may be maintained.

In other embodiments, the structures in SiN may be designed to be athermal, that is the properties of the structures are stable or insensitive to changes in temperature, which can be important for the utility of the laser and the need for additional temperature control or thermal management. For example ring structures may be designed such that the FSR remains relatively stable over temperature. In additional, asymmetric MZIs may be designed so that the path length difference between the arms of the MZI do not change with ambient temperature changes.

All ranges and ratio limits disclosed in the specification and claims may be combined in any manner. Unless specifically stated otherwise, references to "a," "an," and/or "the" may include one or more than one, and that reference to an item in the singular may also include the item in the plural.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:
1. A hybrid laser comprising:
a gain region made from group III-V semiconductor materials and configured to generate an amplified lightwave;
a silicon based photonic integrated circuit (PIC) optically coupled to the gain region to receive the amplified lightwave, and including:
a micro-ring resonator (MRR) including a static ring resonator and a tuned ring resonator, wherein the MRR is:
positioned to receive the amplified lightwave; and
configured to generate and emit a tuned lightwave having a different wavelength range than the amplified lightwave by altering a wavelength range of the amplified lightwave; and
a tuning structure coupled to the tuned ring resonator and configured to alter the wavelength range of the tuned lightwave through changing a repeat mode spacing of the MRR by affecting a free spectral range (FSR) of the tuned ring resonator via altering an index of refraction of the tuned ring resonator, wherein the tuning structure alters the index of refraction of the tuned ring resonator;

a photodetector configured to detect a wavelength and power of the tuned lightwave; and circuitry configured to control the wavelength range of the tuned lightwave by modulating the altering of the index of refraction by the tuning structure based on the detected wavelength and the detected power of the tuned wavelength.

2. The hybrid laser of claim 1, further comprising calibrating optics configured to direct a portion of the tuned lightwave to the photodetector.

3. The hybrid laser of claim 2, wherein the calibrating optics include an interferometer.

4. The hybrid laser of claim 2, wherein:
the calibrating optics include a plurality of interferometers; and
the plurality of interferometers include at least two interferometers having different free spectral ranges.

5. The hybrid laser of claim 1, wherein the PIC further includes an interferometer positioned to receive the tuned lightwave emitted by the MRR, and is configured to further alter the wavelength range of the tuned lightwave and to emit the tuned lightwave.

6. The hybrid laser of claim 5, wherein the interferometer comprises an asymmetric Mach-Zehnder interferometer (AMZI).

7. The hybrid laser of claim 6, wherein:
the AMZI includes a primary path and a reference path, and has a path length difference equal to a difference in the path length of the primary path and the reference path; and
a tuning range defined by a wavelength range of the tuned lightwave emitted by the interferometer is defined by the path length difference.

8. The hybrid laser of claim 1, wherein at least one of the static ring resonator or the tuned ring resonator is a racetrack resonator (RTR) having a shape including two long straight sections connected to circular end waveguides connecting the two long straight sections.

9. The hybrid laser of claim 1, wherein the MRR further includes at least one additional ring resonator configured to affect the wavelength range of the tuned wavelength.

10. The hybrid laser of claim 1, wherein the PIC is made from at least one Silicon (Si) or Silicon Nitride (SiN).

11. The hybrid laser of claim 1, wherein the tuning structure is at least one of a piezoelectric layer or an electro-optically active layer.

12. The hybrid laser of claim 1, wherein a tuning range defined by a wavelength range of the tuned lightwave is greater than 100 nm.

13. The hybrid laser of claim 1, wherein:
the circuitry is further configured to cause the wavelength range of the tuned lightwave to vary in time by a defined pattern, such that the defined pattern has a smallest wavelength step between instances of time; and
a ring radius of at least one of the tuned ring resonator or the static ring resonator matches the smallest wavelength step.

14. The hybrid laser of claim 1, wherein the circuitry is further configured to cause the wavelength range of the tuned lightwave to vary in time by modulating at least one of a parameter of the tuned ring resonator, a parameter of a phase section of the hybrid laser, or a parameter of an interferometer of the calibrating optics.

15. The hybrid laser of claim 1, wherein the circuitry is further configured to modulate an optical power of the tuned lightwave by controlling at least one of a parameter of the gain region or the PIC.

16. A method for tuning a hybrid laser comprising:
generating an amplified lightwave using a gain region of the hybrid laser made from group III-V semiconductor materials;
receiving the amplified lightwave using a silicon based photonic integrated circuit (PIC) of the hybrid laser, wherein the PIC includes a micro-ring resonator (MRR) including a static ring resonator and a tuned ring resonator;
generating a tuned lightwave having a different wavelength range than the amplified lightwave by altering a wavelength range of the amplified lightwave;
controlling the wavelength range of the tuned lightwave by:
altering the wavelength range of the tuned lightwave through changing a repeat mode spacing of the MRR by affecting a free spectral range (FSR) of the tuned ring resonator via altering an index of refraction of the tuned ring resonator using a tuning structure of the hybrid laser that is coupled to the tuned ring resonator, wherein the wavelength range of the tuned lightwave is controlled by altering the index of refraction of the tuned ring resonator;
detecting a wavelength and power of the tuned wavelength using a photodetector; and
modulating the altering of the index of refraction by the tuning structure based on the detected wavelength and power of the tuned wavelength; and
emitting the tuned lightwave.

17. The method laser of claim 16, further comprising:
altering the wavelength range of the tuned lightwave using an interferometer of the hybrid laser.

18. The method of claim 16, wherein the interferometer comprises an asymmetric Mach-Zehnder interferometer (AMZI).

19. The method of claim 18, wherein:
the AMZI includes a primary path and a reference path, and has a path length difference equal to a difference in the path length of the primary path and the reference path; and
a tuning range defined by a wavelength range of the tuned lightwave emitted by the interferometer is defined by the path length difference.

20. The method of claim 16, further comprising affecting the wavelength range of the tuned wavelength using at least one additional ring resonator of the MRR.

21. The method of claim 16, wherein the PIC is made from at least one Silicon (Si) or Silicon Nitride (SiN).

22. The method of claim 16, wherein the tuning structure is at least one of a piezoelectric layer or an electro-optically active layer.

23. The method of claim 16, wherein a tuning range defined by a wavelength range of the tuned lightwave is greater than 100 nm.

24. The method of claim 16, further comprising causing the wavelength range of the tuned lightwave to vary in time by a defined pattern using circuitry of the hybrid laser, such that the defined pattern has a smallest wavelength step between instances of time, wherein a ring radius of at least one of the tuned ring resonator or the static ring resonator matches the smallest wavelength step.

25. The method of claim 16, further comprising causing the wavelength range of the tuned lightwave to vary in time using circuitry of the hybrid laser by modulating at least one of a parameter of the tuned ring resonator, a parameter of a phase section of the hybrid laser, or a parameter of an interferometer of the calibrating optics.

26. The method of claim 16, further comprising using circuitry of the hybrid laser to modulate an optical power of the tuned lightwave by controlling at least one of a parameter of a gain region of the hybrid laser or the PIC of the hybrid laser.

27. A method for tuning a hybrid laser having a gain region made from group III-V semiconductor materials, a silicon based photonic integrated circuit (PIC) optically coupled to the gain region and including a micro-ring resonator (MRR) and a tuning structure, a photodetector, and circuitry, the method comprising:

building a sweep by tuning the MRR to cover a broad wavelength range including a transition from a first mode of the MRR to a second mode of the MRR, wherein:

a spacing between the first mode and the second mode is an increment of a wavelength of the sweep;

the MRR includes a static ring resonator and a tuned ring resonator; and the tuned ring resonator alters a wavelength range of the sweep;

optimizing a side-mode suppression of the sweep by tuning a cavity length of the MRR to match a wavelength of the sweep via altering an index of refraction of the tuned ring resonator, wherein the cavity length of the MRR is controlled by altering the index of refraction of the tuned ring resonator;

in parallel with the building of the sweep or the optimizing of the side-mode suppression ratio, tuning an interferometer to suppress competing modes by removing unwanted wavelengths from the sweep, wherein the suppression of the competing modes extends a single mode tuning range during the sweep.

* * * * *